US008685831B2

(12) United States Patent
Mehrotra

(10) Patent No.: US 8,685,831 B2
(45) Date of Patent: Apr. 1, 2014

(54) TRENCHES WITH REDUCED SILICON LOSS

(75) Inventor: Manoj Mehrotra, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 165 days.

(21) Appl. No.: 13/284,181

(22) Filed: Oct. 28, 2011

(65) Prior Publication Data

US 2012/0104539 A1    May 3, 2012

Related U.S. Application Data

(60) Provisional application No. 61/407,763, filed on Oct. 28, 2010.

(51) Int. Cl.
*H01L 21/76* (2006.01)

(52) U.S. Cl.
USPC .................................. 438/427; 257/E21.548

(58) Field of Classification Search
USPC ................... 438/430, 445, 446; 257/E21.548
See application file for complete search history.

(56) References Cited

U.S. PATENT DOCUMENTS

| 6,207,532 | B1 * | 3/2001 | Lin et al. ........................ 438/430 |
| 7,354,812 | B2 * | 4/2008 | Batra et al. ..................... 438/196 |
| 2007/0218645 | A1 * | 9/2007 | Zhou .............................. 438/427 |
| 2007/0254453 | A1 * | 11/2007 | Ang .............................. 438/425 |

* cited by examiner

*Primary Examiner* — Chandra Chaudhari
(74) *Attorney, Agent, or Firm* — Wade J. Brady, III; Frederick J. Telecky, Jr.

(57) ABSTRACT

An isolation trench in a substrate of a semiconductor device includes a first shallow portion with a dielectric sidewall and a second deeper portion without a dielectric sidewall. The isolation trench is formed by forming a first shallow portion of the trench, forming dielectric sidewalls on the first shallow portion, and then etching the substrate below the first shallow portion to form the second deeper portion. Shallow isolation trenches may be formed simultaneously with the etching of the second deeper portion.

13 Claims, 8 Drawing Sheets

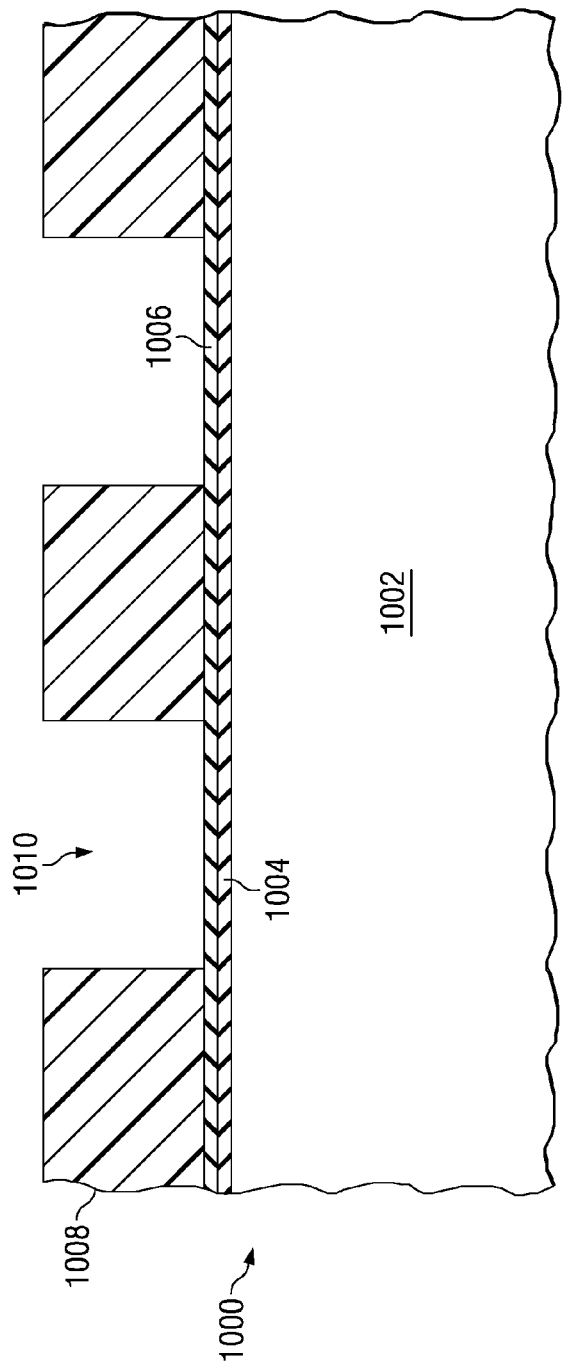
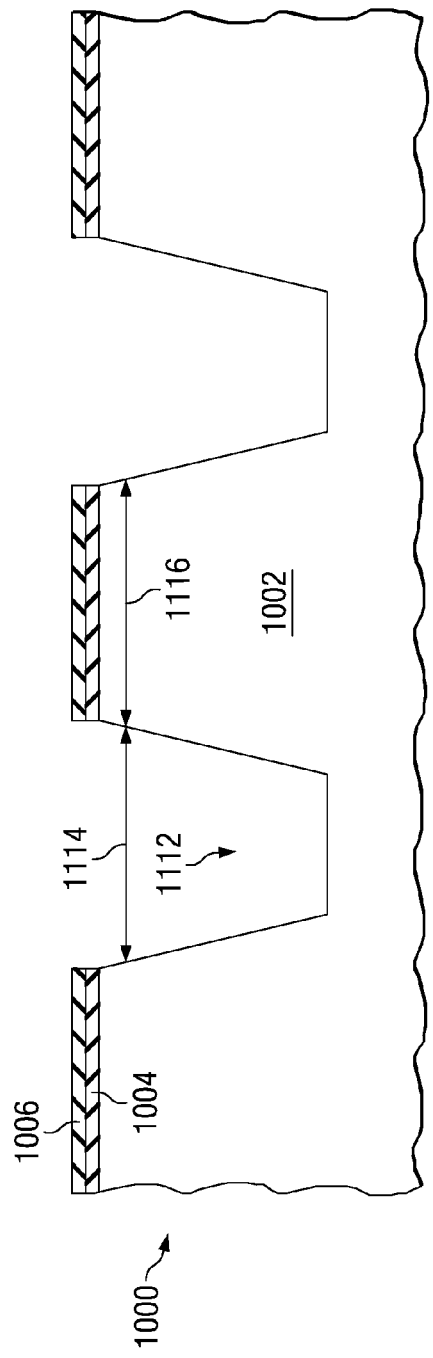

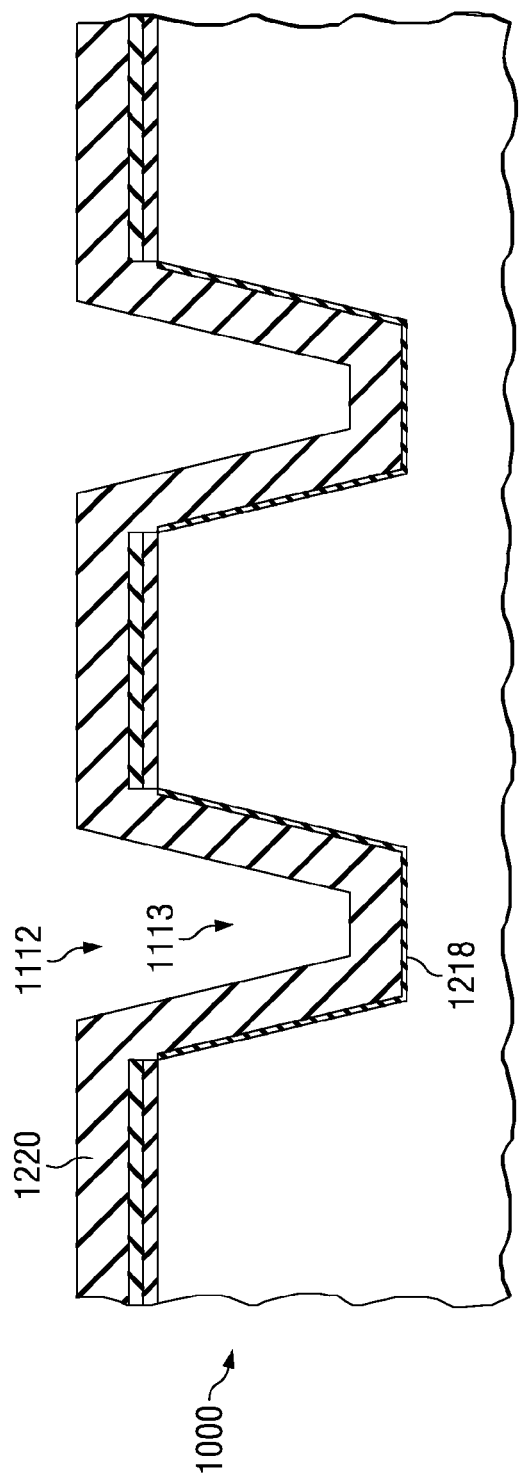
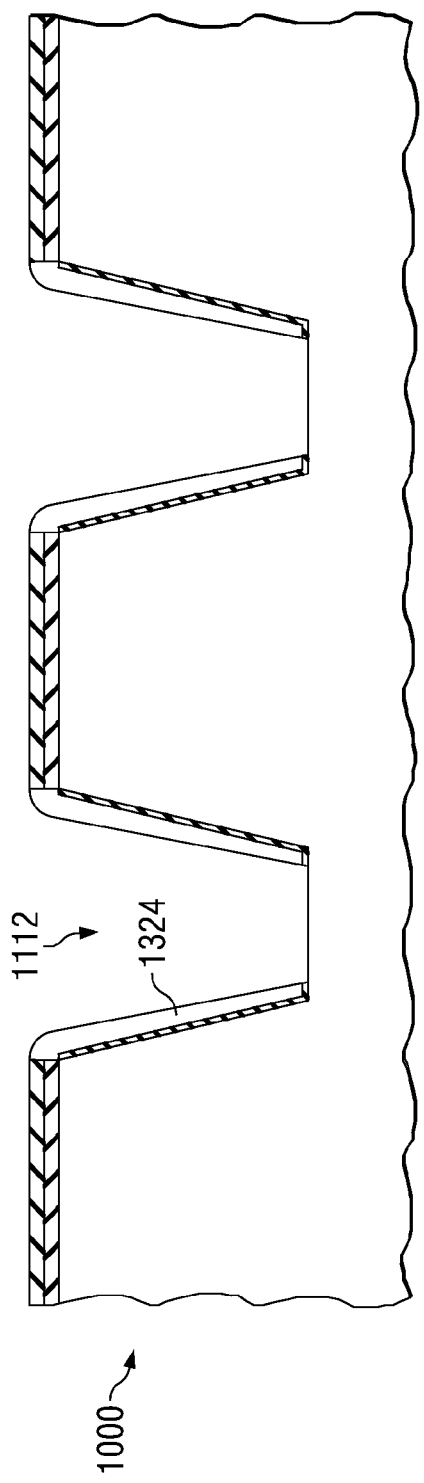

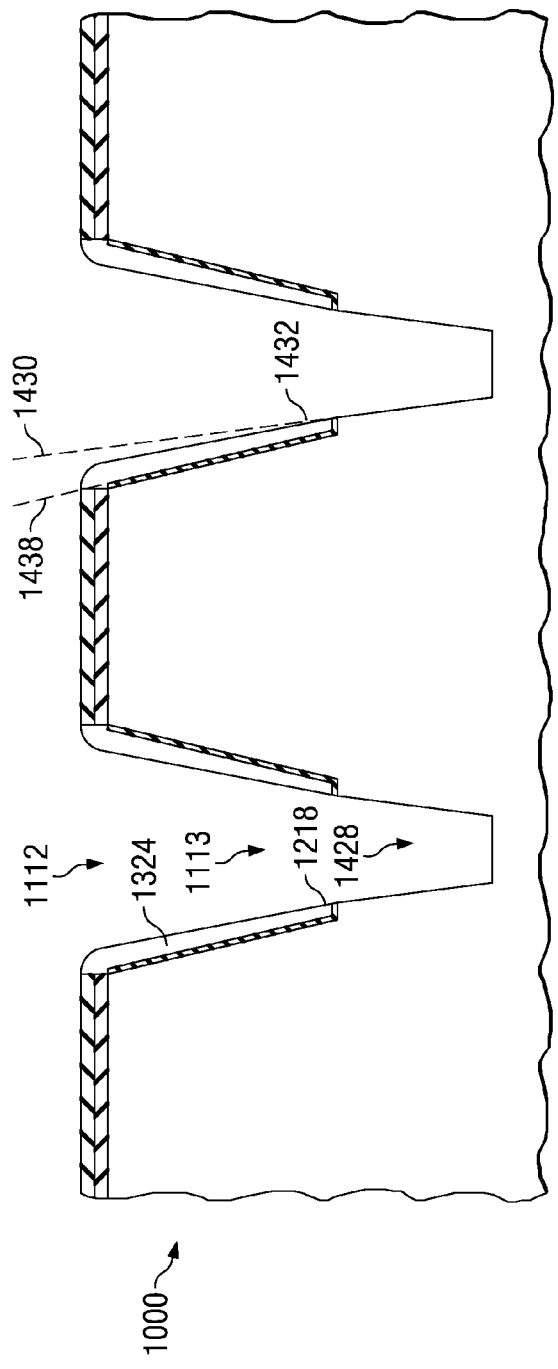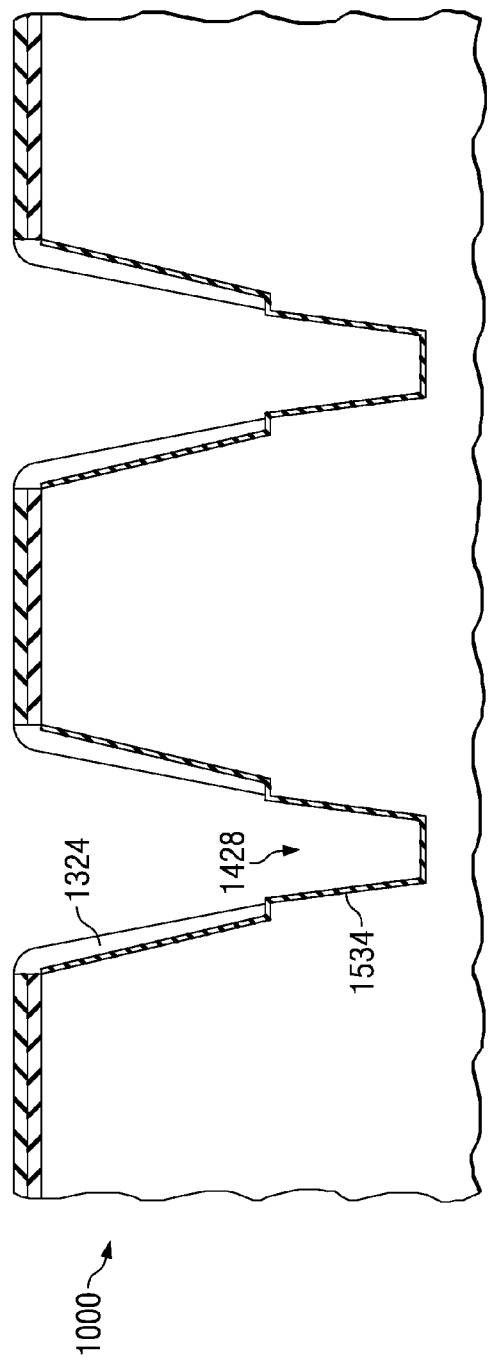

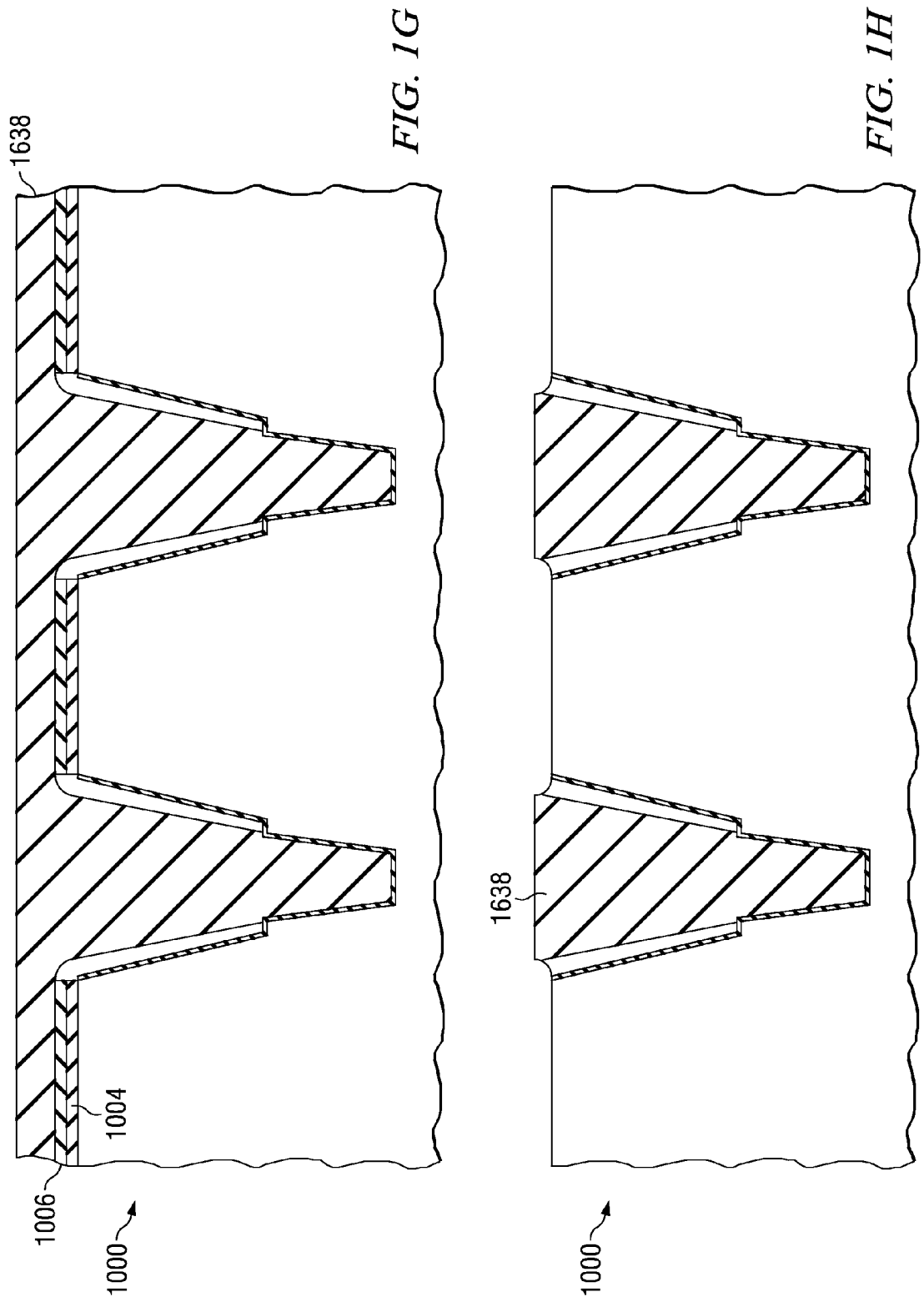

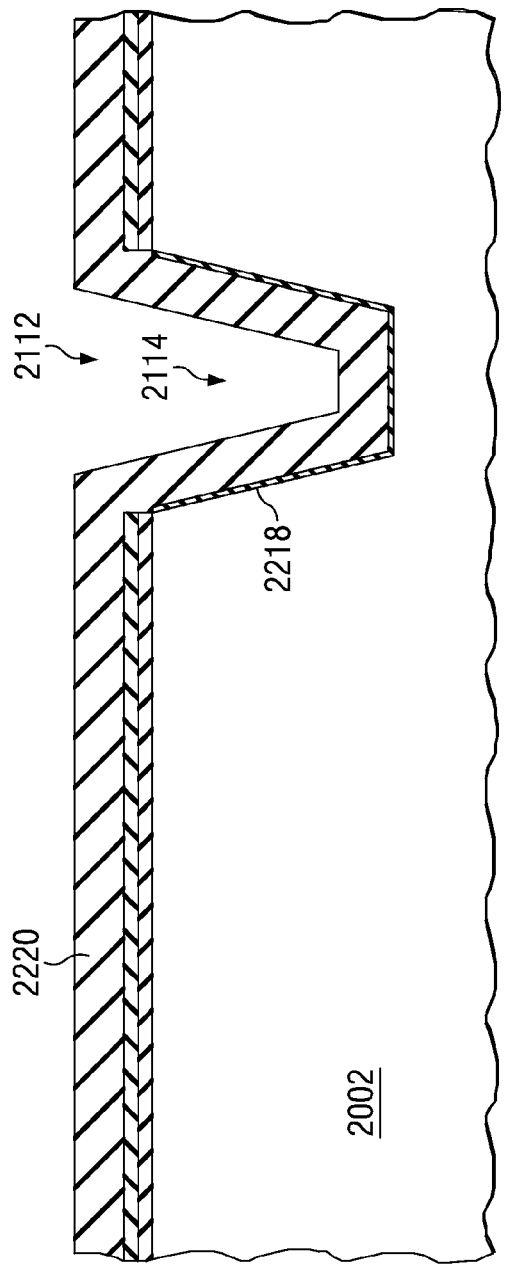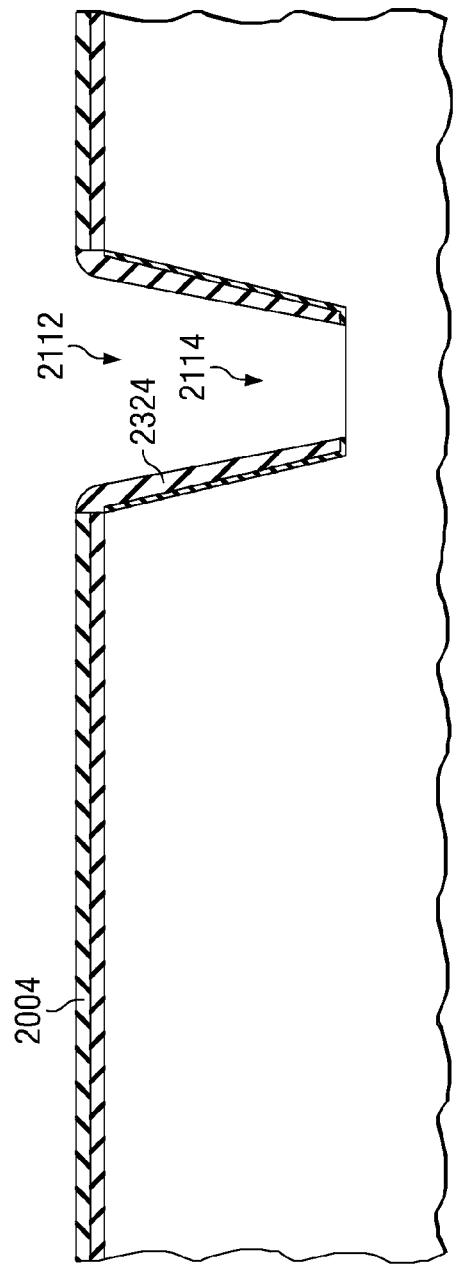

the

TRENCHES WITH REDUCED SILICON LOSS

CROSS-REFERENCE TO RELATED APPLICATIONS

This application claims the benefit of priority under U.S.C. §119(e) of U.S. Provisional Application No. 61/407,763, filed Oct. 28, 2010, the entirety of which is incorporated herein by reference.

The following co-pending patent application is related and hereby incorporated by reference: U.S. patent application Ser. No. 13/284,241. With its mention in this section, this patent application is not admitted to be prior art with respect to the present invention

FIELD OF THE INVENTION

This invention relates to the field of semiconductor devices. More particularly, this invention relates to shallow trench isolation in semiconductor devices.

BACKGROUND OF THE INVENTION

As the dimensions of integrated circuits continue to scale to smaller an smaller dimensions, the electrical isolation of one transistor from the next becomes increasingly difficult. The most commonly used method for electrical isolation is shallow trench isolation (STI) in which shallow trenches are formed between transistors and filled with a dielectric. In instances where the voltage is higher, the trenches must either be made wider or deeper to support the higher voltage. Increasing the active pitch (trench opening width plus active geometry width) by making the trenches wider is the more manufacturable solution, but it also causes the area of the integrated circuit to increase thus reducing the number of chips that may be formed on a wafer with a resultant increase in cost per chip. Making the trenches deeper while keeping the active pitch constant is difficult because trench etch tends to increase the width of the trench opening for deeper trenches. This results in a decrease in the width of the active width resulting in reduced transistor drive current.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In one embodiment, a semiconductor device includes a substrate in which an isolation trench is formed having a shallower portion with a dielectric sidewall and a deeper portion without a dielectric sidewall. The isolation trench contains a dielectric fill material.

In another embodiment, a deep isolation trench is formed in semiconductor device by forming a first pattern containing an opening for a deep isolation trench on a substrate; forming a first shallower portion of the deep isolation trench; forming dielectric sidewalls on walls of the first shallower portion; etching the substrate below the first shallower portion to form a second deeper portion of the deep isolation trench; and filling the deep isolation trench with a dielectric fill material.

Separate shallow isolation trenches may be formed simultaneously with the etching of the second deeper portion

DESCRIPTION OF THE VIEWS OF THE DRAWING

FIG. 1A through 1H are illustrations of steps in the fabrication of a semiconductor device formed according to a first embodiment.

FIG. 2A through 2H are illustrations of steps in the fabrication of a semiconductor device formed according to a second embodiment.

DETAILED DESCRIPTION

Figure 2A:
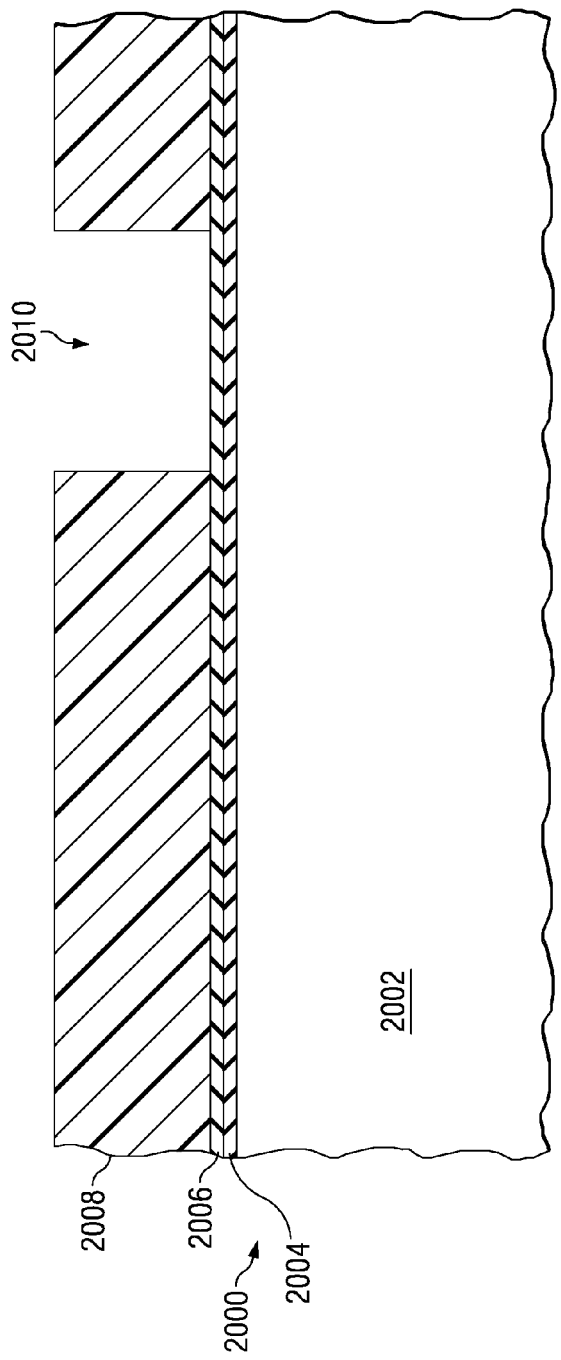

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A method of forming a isolation trench without increasing active pitch according to an embodiment is described in FIGS. 1A through 1H.

FIG. 1A shows a semiconductor device 1000 having a semiconductor substrate 1002 upon which a pad oxide 1004 is grown and a silicon nitride film 1006 is deposited. An active photo resist pattern 1008 is formed on substrate 1002. Photo resist pattern 1008 has openings 1010 in which isolation trenches are to be formed.

FIG. 1B shows semiconductor device 1100 after the silicon nitride film 1006 and the pad oxide layer 1004 are etched and isolation trench 1112 is partially etched into substrate 1002. A first portion 1113 of isolation trench 1112 may be partially etched to a depth of 100 to 500 nm. Etching a minimum width trench deeper may result in erosion of the top of the trench opening causing the top of the trench 1114 to widen and the active width 1116 to become narrower. If the active width 1116 is a transistor channel this will decrease the transistor width with a resulting decrease in transistor drive current which is undesirable.

To prevent erosion of the top of the trench 1112 which would increase the size of the trench opening, a layer of dielectric 1220 is deposited over the partially etched trench as shown in FIG. 1C. Before dielectric layer 1220 is deposited, a liner dielectric 1218 may be grown or deposited and grown. This dielectric liner 1218 may be silicon dioxide or a nitrided silicon dioxide. In a preferred embodiment a liner dielectric 1218 3 nm to 9 nm thick is grown. Dielectric layer 1220 may be a silicon oxide or a silicon nitride dielectric. In a preferred embodiment is a conformal silicon oxide layer 5 nm to 15 nm thick is deposited to form dielectric layer 1220.

As shown in FIG. 1D dielectric layer 1220 is then etched to form sidewalls 1324. The dielectric sidewalls 1324 prevent widening of the upper portion of the trench 1112 when the trench is etched deeper.

The lower portion 1428 of the deep isolation trench 1112 is then etched to a depth of 100 nm to 500 nm as shown in FIG. 1E. The full depth of the isolation trench 1112 (upper portion 1113 depth plus lower portion 1428 depth) may be 200 nm to 1000 nm deep. The slope 1430 of the lower portion 1428 of the trench 1112 may be less vertical than the slope 1428 of the upper portion 1113 of the trench 1112. There also may be a short transition region 1432 between the upper portion of the trench 1426 which was etched prior to formation of the dielectric sidewalls 1324 and the lower portion of the trench 1428 that was etched after formation of the dielectric sidewalls 1324. How pronounced the transition region 1432 appears may be determined by the width of the dielectric sidewall 1324. The slope of the sidewall of the transition region 1432 is less vertical the slope 1430 or the slope 1428.

The trench 1112 is shown in FIG. 1F after a liner dielectric 1534 is grown or deposited on the lower portion 1428 of the trench. The dielectric sidewall 1324 may be removed and the liner oxide formed on both the upper 1113 and lower portions 1428 of the trench but the preferred embodiment is not to remove the dielectric sidewall 1324. The liner dielectric may be a thermally grown dielectric such as silicon dioxide or may be a deposited dielectric such as silicon oxynitride or silicon nitride. In a preferred embodiment, a liner dielectric of thermal silicon dioxide is grown to 3 nm to 9 nm.

The trench 1112 is filled with dielectric 1638 and planarized as shown in FIGS. 1G and 1H using commonly used procedures. Dielectric 1638 may be a deposited dielectric such as sub atmospheric chemical vapor deposition (SACVD) oxide, high density plasma (HDP) oxide or high aspect ratio (HARP) oxide as shown in FIG. 1G.

FIG. 1H shows the semiconductor device 1000 after planarization by chemical mechanical polishing (CMP) and removal of the silicon nitride film 1006 and removal of the pad oxide layer 1004. Additional processing may then be performed to build transistors and other electrical devices and also to build the interconnection layers to complete the semiconductor device.

In some applications it may be desirable to form deep trenches on portions of the chip where high voltage circuits are constructed and to form shallow trenches where low voltage circuits are constructed. One embodiment in which both deep and shallow isolation trenches are simultaneously formed is illustrated in FIGS. 2A through 2H.

In FIG. 2A, pad oxide 2004 is grown and silicon nitride film 2006 is deposited on silicon substrate 2002 of semiconductor device 2000. A first active photoresist pattern 2008 is then formed over silicon substrate 2002 with openings 2010 where the deep isolation trenches which may be used to isolate high voltage devices are to be formed.

Figure 2B:
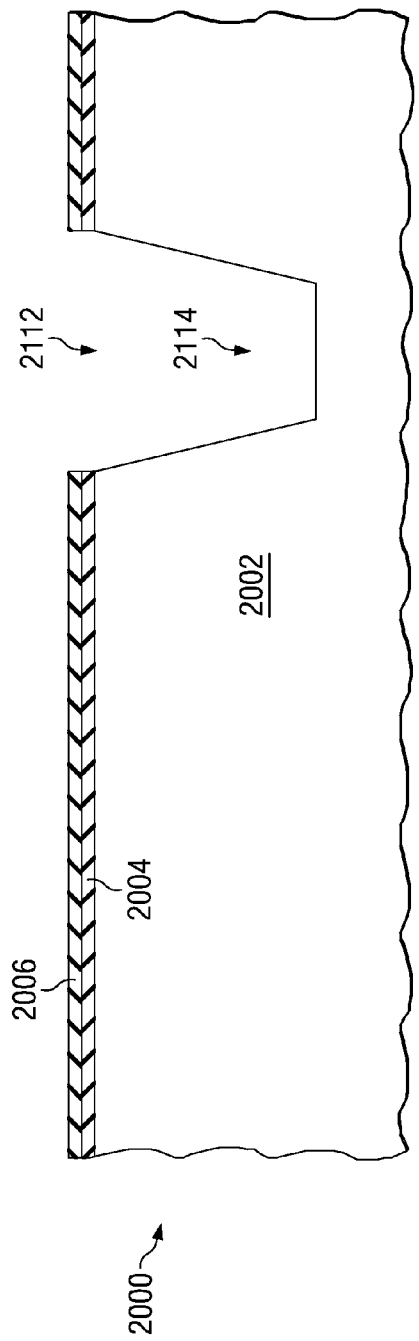

A first portion 2114 of deep isolation trench 2112 is etched and active photoresist pattern 2008 is removed as shown in FIG. 2B. The photo resist pattern 2008 may be removed prior to or post trench etch. It is preferred to remove the pattern 2008 after the silicon nitride layer 2006 and pad oxide layer 2004 have been etched and before the silicon substrate 2002 is etched to reduce etch microloading effects which may cause the trench depth and sidewall profile to vary across the chip and across the wafer. The first portion 2114 of the deep isolation trench 2112 may be etched to a depth of 100 to 500 nm.

In FIG. 2C, a conformal dielectric layer 2220 is deposited over the substrate 2002. Before dielectric layer 2220 is deposited, a liner dielectric 2218 may be grown or deposited. This liner dielectric 2218 may be silicon dioxide or a nitrided silicon dioxide. In a preferred embodiment a thermal liner oxide 3 nm to 9 nm is grown. Dielectric layer 2220 may be a silicon oxide or a silicon nitride dielectric. In an embodiment a conformal silicon dioxide layer 5 nm to 15 nm thick is deposited and, in a preferred embodiment, a 7 nm thick film is deposited.

In FIG. 2D the dielectric layer 2220 is etched anisotropically to form sidewalls 2324 on the first portion 2114 of deep isolation trench 2112. The preferred embodiment is silicon dioxide. Where dielectric layer 2200 is silicon dioxide, silicon nitride layer 2006 may be used as an etch stop during formation of the sidewalls 2324.

Figure 2E:
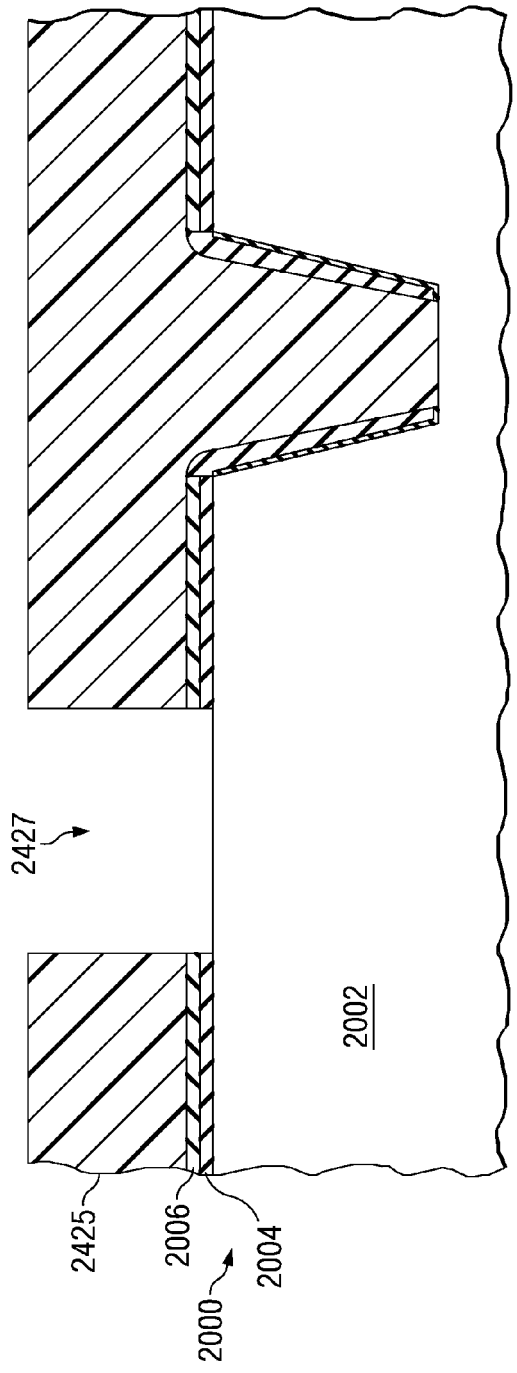

In FIG. 2E a second active photoresist pattern 2425 is formed over the substrate 2001 with openings 2427 over the areas where shallow isolation trenches are to be formed. Silicon nitride layer 2006 and pad oxide layer 2004, which form a hardmask, are etched in the patterned shallow trench openings 2427. The second active photoresist pattern 2428 is then removed prior to the second trench etch.

Figure 2F:
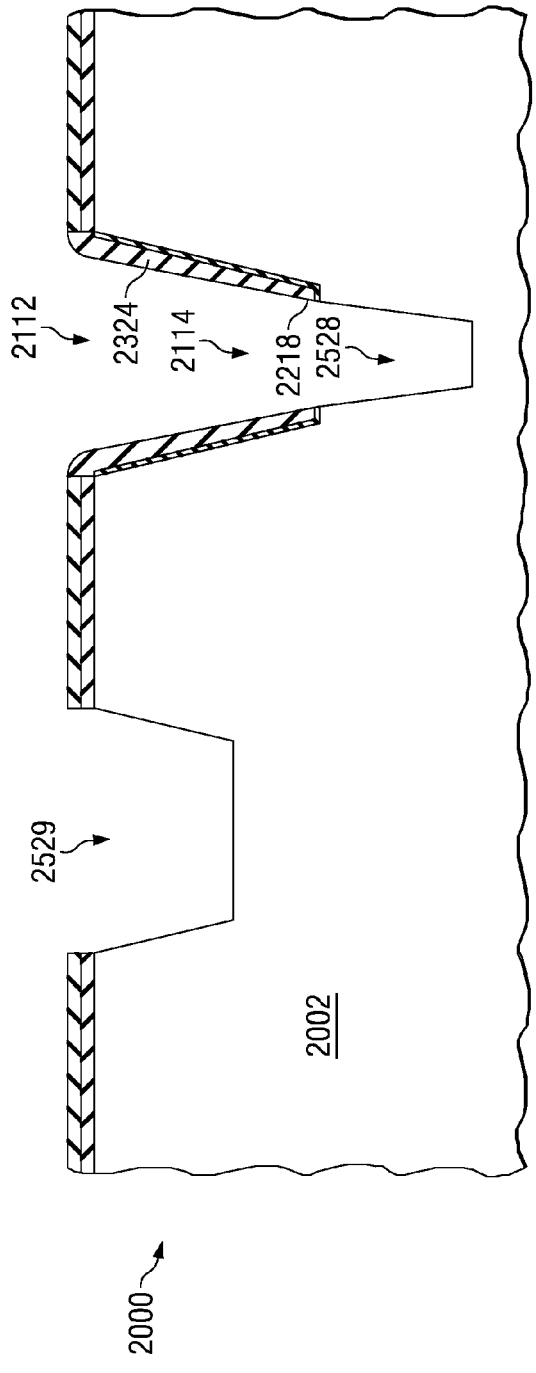

Shallow isolation trench 2529 and the lower portion 2528 of deep trench 2112 are etched together as shown in FIG. 2F. The shallow trench 2529 may be etched to a depth of 100 to 500 nm and the deep trench 2112 may be increased in depth by 100 nm to 500 nm. The final depth of deep trench 2112 may be 200 nm to 1000 nm.

Figure 2G:
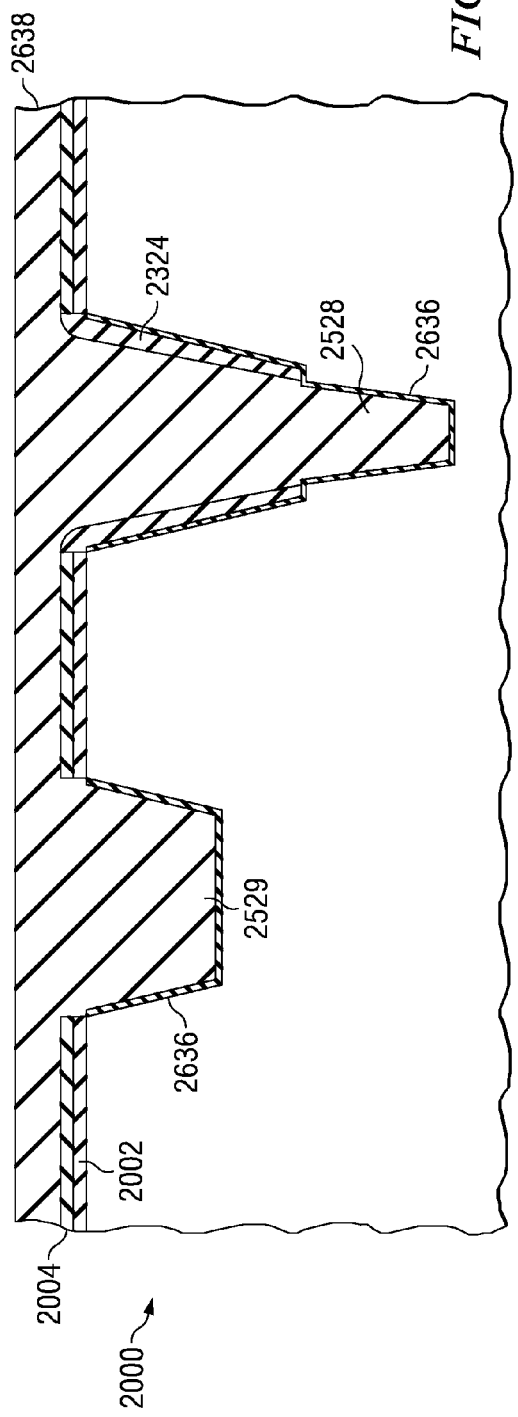

FIG. 2G shows a view of the semiconductor device 2000 after a dielectric liner 2636 has been thermally grown or deposited and the trenches 2529 and 2112 filled with a dielectric 2638. The dielectric liner may be a thermally grown dielectric such as silicon dioxide or may be a deposited dielectric such as silicon oxynitride or silicon nitride. In a preferred embodiment a dielectric liner of thermal silicon dioxide is grown to a thickness of 3 nm to 9 nm. The dielectric sidewalls 2324 may be removed prior to formation of the dielectric liner but the preferred embodiment is to leave dielectric sidewalls 2324 in place.

Figure 2H:
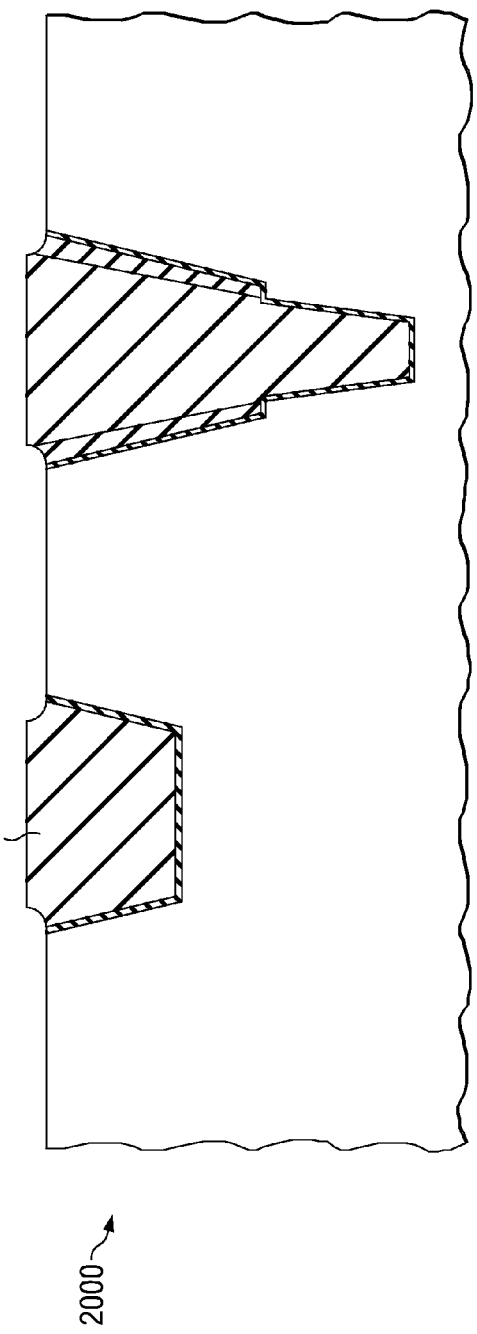

The dielectric 2638 is then planarized and the silicon nitride layer 2006 and pad oxide layer 2004 removed as shown in FIG. 2H. Additional processing to form devices and interconnection may then be performed to complete the semiconductor device.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps of:
   forming a first pattern containing an opening for a deep isolation trench on a substrate of said semiconductor device;
   forming a first shallower portion of said deep isolation trench;
   forming dielectric sidewalls on walls of said first shallower portion;
   etching said substrate below said first shallower portion to form a second deeper portion of said deep isolation trench;

filling said deep isolation trench with a dielectric fill material;

forming a second photoresist pattern with openings for a shallow isolation trench on said substrate prior to said step of etching said substrate below said first shallower portion to form a second deeper portion of said deep isolation trench;

etching said second photoresist pattern into a hardmask on said substrate;

removing said second photoresist pattern;

etching said shallow trench isolation trench at the same time said second deeper portion of said deep isolation trench is etched; and filling said shallow isolation trench with said dielectric fill material at the same time as filling said deep isolation trench with a dielectric fill material.

2. The method of claim 1 wherein a depth of said first shallower portion is in the range of 100 nm to 500 nm.

3. The method of claim 1 wherein a depth of said second deeper portion is in the range of 100 nm to 500 nm.

4. The method of claim 1 wherein a depth of said shallow trench isolation is in the range of 100 to 500 nm and wherein a depth of said deep trench isolation is in the range of 200 to 1000 nm.

5. The method of claim 1 wherein a thickness of said dielectric sidewalls is in the range of 5 nm to 15 nm.

6. The method of claim 1 wherein a transition region is formed between said first portion and said second portion wherein a slope of a sidewall of said transition region is less vertical than a slope of a sidewall of said first portion and is less vertical than a slope of a sidewall of said second portion.

7. The method of claim 1 wherein said dielectric sidewalls are silicon dioxide.

8. A method of forming a semiconductor device, comprising;

forming a first photoresist pattern on a substrate of said semiconductor device with a pattern opening for a deep isolation trench;

etching a first shallow portion of said deep trench isolation trench;

forming a dielectric sidewall on said first shallow portion;

forming a second photoresist pattern on said substrate with a pattern opening for a shallow isolation trench;

etching said second photoresist pattern into a hardmask on said substrate;

etching said shallow trench isolation trench and additionally etching said substrate below said first shallow portion to form a second deeper portion of said deep isolation trench; and filling said shallow isolation trench and said deep isolation trench with a dielectric fill material.

9. The method of claim 8 wherein a depth of said first shallow portion is in the range of 100 to 500 nm.

10. The method of claim 8 wherein a depth of said shallow isolation trench is in the range of 100 nm to 500 nm and the depth of said deep isolation trench is in the range of 200 nm to 1000 nm.

11. The method of claim 8 wherein a thickness of said dielectric sidewall is in the range of 5 to 15 nm.

12. The method of claim 8 wherein a transition region is formed between said first shallow portion and said deeper second portion wherein a slope of a sidewall of said transition region is less vertical than a slope of a sidewall of said first portion and is less vertical than a slope of a sidewall of said second portion.

13. The method of claim 8 wherein said dielectric sidewall is silicon dioxide.

* * * * *